(12) United States Patent
Lee

(10) Patent No.: US 9,025,395 B2
(45) Date of Patent: May 5, 2015

(54) DATA TRANSMISSION CIRCUIT

(75) Inventor: Sang Kwon Lee, Yongin-si (KR)

(73) Assignee: SK Hynix Inc., Gyeonggi-do (KR)

( * ) Notice: Subject to any disclaimer, the term of this patent is extended or adjusted under 35 U.S.C. 154(b) by 656 days.

(21) Appl. No.: 13/359,997

(22) Filed: Jan. 27, 2012

(65) Prior Publication Data

US 2012/0218832 A1 Aug. 30, 2012

(30) Foreign Application Priority Data

Feb. 28, 2011 (KR) .................. 10-2011-0018169

(51) Int. Cl.
*G11C 7/00* (2006.01)
*G11C 7/10* (2006.01)
*G11C 11/4096* (2006.01)

(52) U.S. Cl.
CPC .............. *G11C 7/1096* (2013.01); *G11C 7/106* (2013.01); *G11C 7/1069* (2013.01); *G11C 7/1087* (2013.01); *G11C 11/4096* (2013.01)

(58) Field of Classification Search
CPC ........................... G11C 11/5642; G11C 16/26
USPC ........ 365/189.05, 189.11, 226; 327/538, 539, 327/540, 541
See application file for complete search history.

(56) References Cited

U.S. PATENT DOCUMENTS

| | | | |
|---|---|---|---|
| 5,901,102 A * | 5/1999 | Furutani | 365/226 |
| 2004/0001551 A1* | 1/2004 | Chung et al. | 375/257 |
| 2004/0170080 A1* | 9/2004 | Huber | 365/230.06 |
| 2006/0002222 A1* | 1/2006 | Lee | 365/226 |
| 2010/0142305 A1* | 6/2010 | Lee | 365/226 |
| 2012/0195133 A1* | 8/2012 | Ko | 365/189.05 |

* cited by examiner

*Primary Examiner* — Son Dinh
*Assistant Examiner* — Uyen B Tran
(74) *Attorney, Agent, or Firm* — William Park & Associates Ltd.

(57) ABSTRACT

A data transmission circuit includes: a driving voltage generation unit configured to generate a driving voltage having a lower level than an external driving voltage; a switch unit configured to transmit the driving voltage when any one of a write enable signal and a read enable signal is enabled; and a data transmission unit configured to be driven by receiving the driving voltage, transmit a signal of a DQ pad as data in response to the write enable signal, and transmit the data to the DQ pad in response to the read enable signal.

18 Claims, 5 Drawing Sheets

DATA TRANSMISSION CIRCUIT

CROSS-REFERENCES TO RELATED APPLICATIONS

The present application claims priority under 35 U.S.C 119(a) to Korean Application No. 10-2011-0018169, filed on Feb. 28, 2011 in the Korean intellectual property Office, which is incorporated by reference herein in its entirety as set forth in full.

BACKGROUND

With the technology advancements in the fields of computer systems and electronic communications, semiconductor memory devices used for storing information have been gradually reduced in price and size but increased in capacity. Furthermore, as demand for energy efficiency also increases, semiconductor memory devices have been developed to suppress unnecessary current consumption.

Meanwhile, a variety of drivers should be provided to perform a read or write operation in DRAM. For example, DRAM requires a driver which drives a global input/output line to transmit data to the global input/output line during the read operation, and a driver which drives the global input/output line to transmit data inputted through a DQ pad to the global input/output line during the write operation.

In general, the drivers included in DRAM are implemented with MOS transistors. The MOS transistors are driven by a driving voltage VDDL that has a lower level than a power supply voltage VDD, in order to reduce current consumption during the read or write operation. Since such MOS transistors use the low-level driving voltage VDDL, MOS transistors that have a low threshold voltage are used.

However, since MOS transistors that have a low threshold voltage have a large amount of channel leakage current in a region where the read or write operation is excluded, a standby current increases. As a result, current consumption inevitably increases.

SUMMARY

An embodiment of the present invention relates to a data transmission circuit capable of reducing current consumption by blocking the supply of a driving voltage having a lower level than a power supply voltage when a read or write operation is not performed.

In one embodiment, a data transmission circuit includes: a driving voltage generation unit configured to generate a driving voltage having a lower level than an external driving voltage; a switch unit configured to transmit the driving voltage when any one of a write enable signal and a read enable signal is enabled; and a data transmission unit configured to be driven by receiving the driving voltage, transmit a signal of a DQ pad as data in response to the write enable signal, and transmit the data to the DQ pad in response to the read enable signal.

In another embodiment, a data transmission circuit includes: a data transmission unit configured to be driven by receiving a driving voltage, transmit a signal of a DQ pad as data in response to a write enable signal, and transmit the data to the DQ pad in response to a read enable signal, wherein the driving voltage has a lower level than an external voltage, and the driving voltage is transmitted when any one of the write enable signal and the read enable signal is enabled.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

Figure 1:
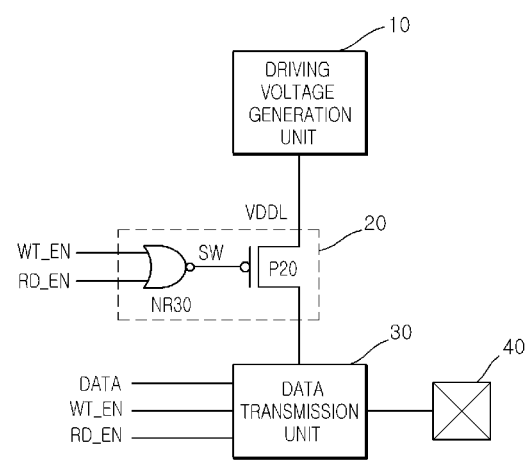
FIG. 1 is a block diagram of a data transmission circuit in accordance with an embodiment of the present invention.

FIG. 1 is a block diagram of a data transmission circuit in accordance with an embodiment of the present invention.

Referring to FIG. 1, the data transmission circuit according to the described embodiments includes a driving voltage generation unit 10, a switch unit 20, a data transmission unit 30, and a DQ pad 40.

The driving voltage generation unit 10 is configured to generate a driving voltage VDDL having a lower level than a power supply voltage VDD.

The switch unit 20 includes a switch signal generation section NR30 and a switch element P20. The switch signal generation section NR30 is configured to receive a write enable signal WT_EN and a read enable signal RD_EN and perform a NOR operation on the received signals to generate a switch signal SW. The switch element P20 is configured to transmit the driving voltage VDDL in response to the switch signal SW.

More specifically, the switch unit 20 is configured to supply the driving voltage VDDL to the data transmission unit 30 when any one of the write enable signal WT_EN and the read enable signal RD_EN is enabled, and block a supply of the driving voltage VDDL when both of the write enable signal WT_EN and the read enable signal RD_EN are disabled. Here, the write enable signal WT_EN includes a signal which is enabled during a write operation, and the read enable signal RD_EN includes a signal which is enabled during a read operation.

Figure 2:
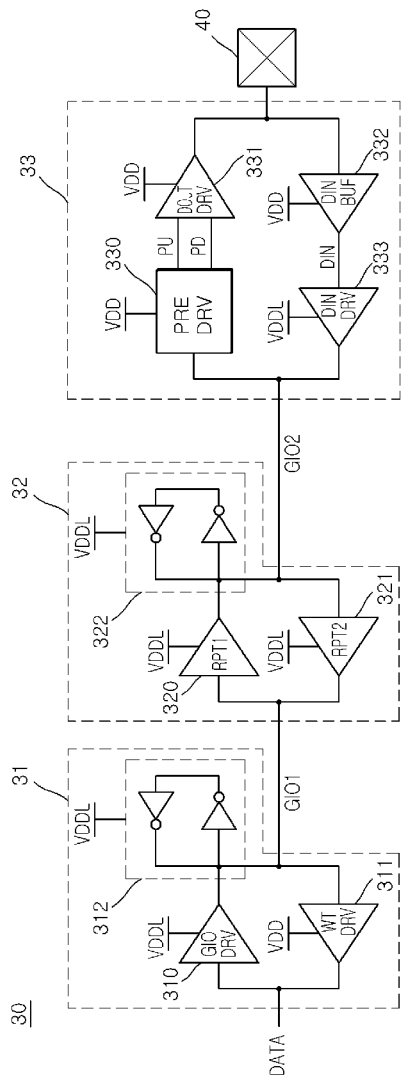
FIG. 2 is a block diagram of a data transmission unit illustrated in FIG. 1.

Referring to FIG. 2, the data transmission unit 30 includes a first transmission section 31, a second transmission section 32, and a third transmission section 33.

The first transmission section 31 includes a global driver 310, a write driver 311, and a first latch 312. The global driver 310 is configured to receive data DATA and drive a global line GIO1 to the level of the driving voltage VDDL, when the read enable signal RD_EN is enabled. The write driver 311 is configured to receive a signal of the first global line GIO1 and drive the data DATA to the level of the power supply voltage VDD, when the write enable signal WT_EN is enabled. The first latch 312 is configured to latch the signal of the first global line GIO1.

Figure 3:
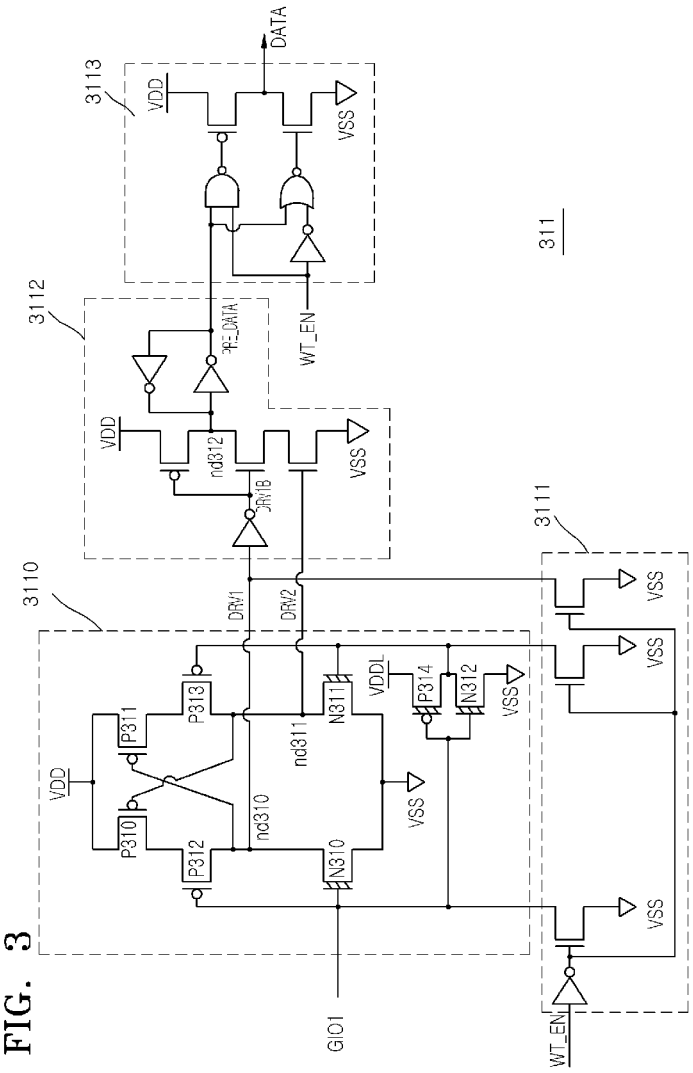
FIG. 3 is a circuit diagram of a write driver illustrated in FIG. 2.

More specifically, referring to FIG. 3, the write driver 311 includes a first level shifter 3110, a first driving controller 3111, a first driver 3112, and a first output section 3113. The first level shifter 3110 is configured to receive the signal of the first global line GIO1 and drive nodes nd310 and nd311 to drive first and second driving signals DRV1 and DRV2 to the level of the power supply voltage VDD or a ground voltage VSS. The first driving controller 3111 is configured to control a drive of the first level shifter 3110 in response to the write enable signal WT_EN. The first driver 3112 is configured to receive the first and second driving signals DRV1 and DRV2 and drive a node nd312 to the level of the power supply voltage VDD and the ground voltage VSS to generate preliminary data PRE_DATA. The first output section 3113 is configured to receive the preliminary data PRE_DATA in response to the write enable signal WT_EN, and drive the data DATA to the level of the power supply voltage VDD or the ground voltage VSS. Here, transistors N310, N311, N312, and P314 of the first level shifter 3110 may include transistors having a low threshold voltage, and transistors P310, P311, P312, and P313 may have a higher threshold voltage than the transistors N310, N311, N312, and P314.

The first driver 3112 receives the first and second driving signals DRV1 and DRV2 and drives the node nd312 to control a duty rate of the preliminary data PRE_DATA.

Figure 4:
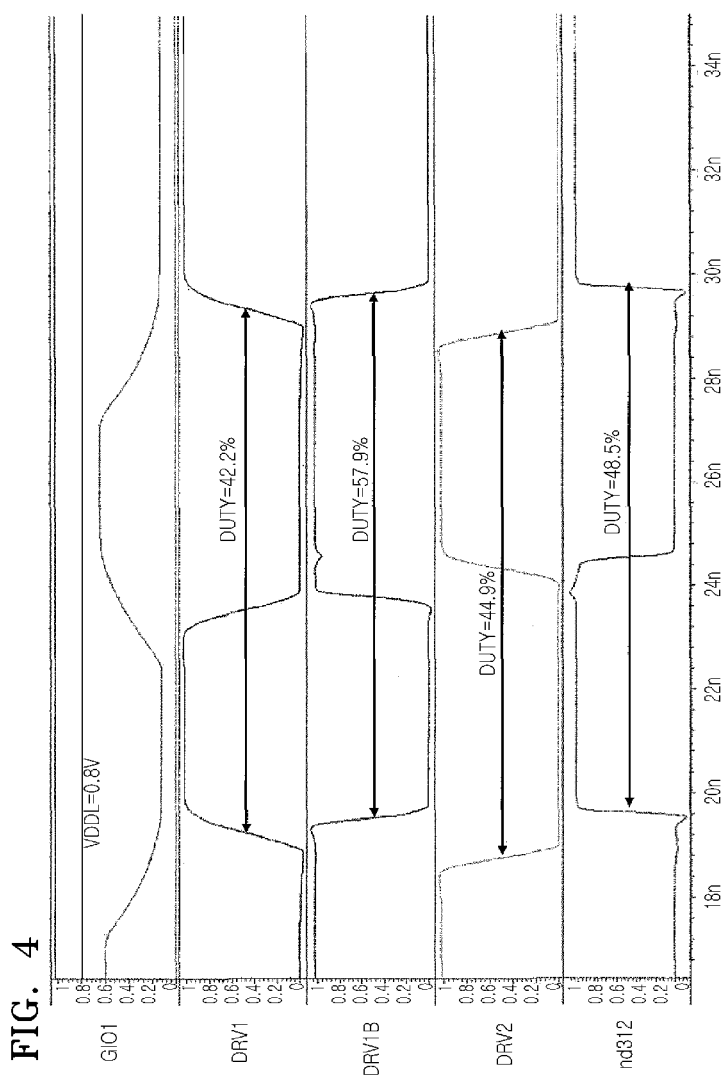
FIG. 4 shows input/output waveforms of a first driver illustrated in FIG. 3.

Referring to FIG. 4, a method for controlling the duty rate of the preliminary data PRE_DATA generated by the first driver 3112 will be described. In the following descriptions, a case in which a signal of the first global line GIO1 changes from a logic high level to a logic low level will be taken as an example.

When the signal of the first global line GIO1 changes from a logic low level to a logic high level, a low level period of the first driving signal DRV1 becomes larger than a high level period thereof. In this case, the duty rate is 42.2%. Furthermore, a low level period of the second driving signal DRV2 becomes larger than a high level period thereof. In this case, the duty rate is 44.9%. An inverted signal DRV1B of the first driving signal DRV1 is generated at a duty rate of 57.9%. Therefore, the signal of the node nd312 changes to a logic high level at a time point where the inverted signal DRV1B is generated at a logic low level, and changes to a logic low level at a time point where the inverted signal DRV1B and the second driving signal DRV2 are generated at a logic high level. Accordingly, the duty rate of the node nd312 corresponds to 48.5%. Here, the duty rate indicates a percentage of one period of a signal that a logic high level occupies.

Returning now to FIG. 2, the second transmission section 32 includes a first repeater 320, a second repeater 321, and a second latch 322. The first repeater 320 is configured to receive the signal of the first global line GIO1 and drive the second global line GIO2 to the level of the driving voltage VDDL or the ground voltage VSS, when the read enable signal RD_EN is enabled. The second repeater 321 is configured to receive a signal of the second global line GIO2 and drive the first global line GIO1 to the level of the driving voltage VDDL or the ground voltage VSS, when the write enable signal WT_EN is enabled. The second latch 322 is configured to latch the signal of the second global line GIO2.

The third transmission section 33 includes a pre-driver 330, an output driver 331, an input buffer 332, and an input driver 333. The pre-driver 330 is configured to receive the signal of the second global line GIO2 and pull-up and pull-down drive signals PU and PD to the level of the power supply voltage VDD or the ground voltage VSS, when the read enable signal RD_EN is enabled. The output driver 331 is configured to drive a DQ pad 40 to the level of the power supply voltage VDD or the ground voltage VSS in response to the pull-up and pull-down signals PU and PD. The input buffer 332 is configured to receive a signal of the DQ pad 40 and drive input data DIN to the level of the power supply voltage VDD or the ground voltage VSS, when the write enable signal WT_EN is enabled. The input driver 333 is configured to receive the input data DIN and drive the second global line GIO2 to the level of the driving voltage VDDL or the ground voltage VSS.

Figure 5:
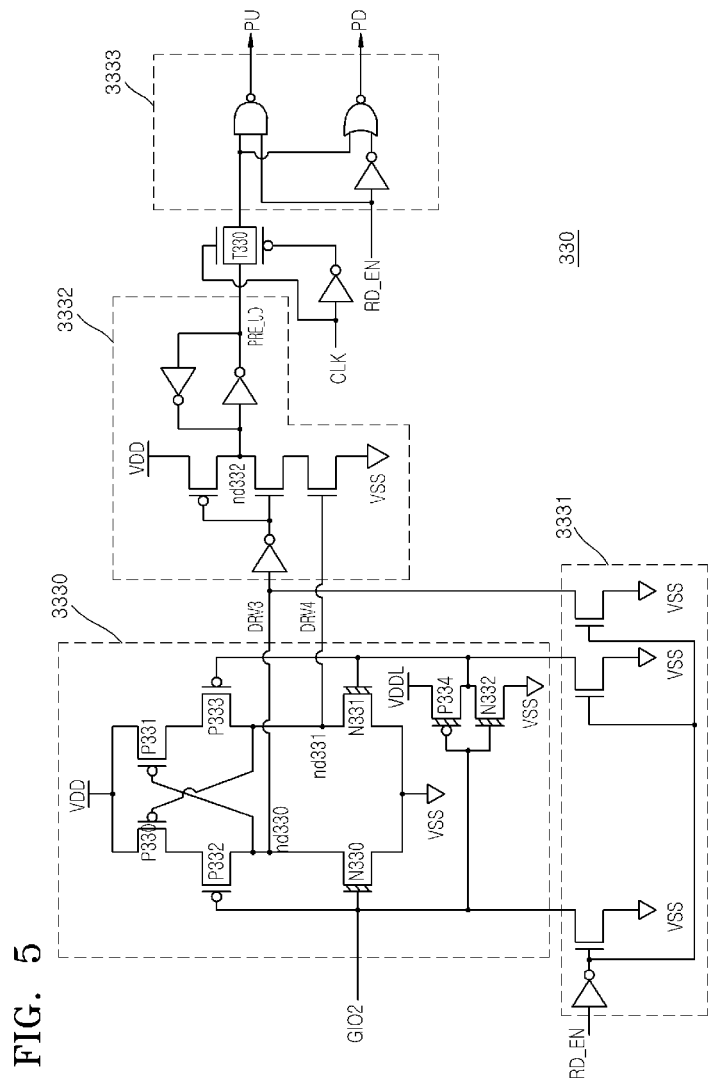
FIG. 5 is a circuit diagram of a pre-driver illustrated in FIG. 2.

More specifically, referring to FIG. 5, the pre-driver 330 includes a second level shifter 3330, a second driving controller 3331, a second driver 3332, a transmission gate T330, and a second output section 3333. The second level shifter 3330 is configured to receive the signal of the second global line GIO2 and drive nodes nd330 and nd331 to drive third and fourth driving signals DRV3 and DRV4 to the level of the power supply voltage VDD or the ground voltage VSS. The second driving controller 3331 is configured to control the drive of the second level shifter 3330 in response to the read enable signal RD_EN. The second driver 3332 is configured to receive the third and fourth driving signals DRV3 and DRV4 and drive a node nd332 to the level of the power supply voltage VDD or the ground voltage VSS to generate a preliminary up-down signal PRE_UD. The transmission gate T330 is configured to transmit the preliminary up-down signal PRE_UD in response to an external clock signal CLK. The second output section 3333 is configured to receive the preliminary up-down signal PRE_UD and in response to the read enable signal RD_EN, drive the pull-up and pull-down signals PU and PD to the level of the power supply voltage VDD or the ground voltage VSS. Here, transistors N330, N331, N332, and P334 may include transistors having a low threshold voltage, and transistors P330, P331, P332, and P333 may have a higher threshold voltage than the transistors N330, N331, N332, and P334.

Furthermore, the second driver 3332 performs the same operation as the above-described first driver 3112, receives the third and fourth driving signals DRV3 and DRV4, and drives the node nd332 to control the duty rate of the preliminary up-down signal PRE_UD.

Referring to FIGS. 1 to 5, the operation of the data transmission circuit in accordance with an embodiment of the present invention will be described. The following descriptions will focus on a read operation, in particular, a case in which the logic level of data is a logic high level.

The driving voltage generation unit 10 generates a driving voltage VDDL having a lower level than the power supply voltage VDD.

During a read operation, the switch signal generation section NR20 of the switch unit 20 receives a read enable signal RD_EN enabled to a logic high level and a write enable signal WT_EN disabled to a logic low level, and outputs a low-level switch signal SW, and the switch element P20 is turned on in response to the switch signal SW, and supplies the driving voltage VDDL to the data transmission unit 30.

The global driver 310 of the first transmission section 31 receives high-level data DATA and drives the first global line GIO1 to the level of the driving voltage VDDL, and the write driver 311 is not driven in response to the low-level write enable signal WT_EN. More specifically, the first driving controller 3111 included in the write driver 311 turns off the transistors N310 and N311 of the first level shifter 3110 in response to the low-level write enable signal WT_EN such that the first level shifter 3110 is not driven. Furthermore, the first latch 312 latches the signal of the first global line GIO1.

The first repeater 320 of the second transmission section 32 receives the signal of the first global line GIO1 having the level of the driving voltage VDDL and drives the second global line GIO2 to the level of the ground voltage VSS. The second repeater 321 is not driven in response to the low-level write enable signal. Furthermore, the second latch 322 latches the signal of the second global line GIO2.

The pre-driver 330 of the third transmission section 33 receives the signal of the global line GIO2 having the level of the ground voltage VSS, and drives the pull-up and pull-down signals PU and PD to the level of the power supply voltage VDD. More specifically, the second level shifter 3330 included in the pre-driver 330 receives the signal of the second global line GIO2 having the level of the ground voltage VSS and turns on the transistor N331 such that the node nd331 is driven to the level of the ground voltage VSS to generate the fourth driving signal DRV4 at the level of the ground voltage VSS. Furthermore, the transistor P330 is turned on in response to the signal of the node nd331, and the transistor P332 which is turned on in response to the signal of the global line GIO2 such that the node nd330 is driven to the level of the power supply voltage VDD to generate the third driving signal DRV3. The second driver 3332 drives the node nd332 to the level of the power supply voltage VDD to drive the preliminary up-down signal PRE_UD to the level of the ground voltage VSS, in response to the third and fourth driving signals DRV3 and DRV4, and the transmission gate T330 transmits the preliminary up-down signal PRE_UD in response to the external clock signal CLK. The second output section 3333 drives the pull-up and pull-down signals PU and PD to the level of the power supply voltage VDD in response to the high-level read enable signal RD_EN.

The output driver 331 drives the DQ pad 40 to the level of the power supply voltage VDD and output high-level data, in response to the pull-up and pull-down signals PU and PD.

The input buffer 332 is not driven in response to the low-level write enable signal WT_EN, and the input driver 333 is not driven in response to the low-level write enable signal WT_EN.

Such a data transmission circuit is driven by a driving voltage having a lower level than a power supply voltage during a read or write operation, and the supply of the driving voltage is blocked when a read or write operation is not performed. Therefore, it is possible to reduce current consumption.

Embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A data transmission circuit comprising:
   a driving voltage generation unit configured to generate a driving voltage having a lower level than an external driving voltage;
   a switch unit configured to transmit the driving voltage when any one of a write enable signal and a read enable signal is enabled;
   a first transmission section configured to receive a data to drive a first global line to the driving voltage level, when the read enable signal is enabled, and receive a signal of the first global line to drive the data to a power supply voltage level, when the write enable signal is enabled;
   a second transmission section configured to receive the signal of the first global line to drive a second global line to the driving voltage level, when the read enable signal is enabled, and receive a signal of the second global line to drive the first global line to the driving voltage level, when the write enable signal is enabled; and
   a third transmission section configured to receive the signal of the second global line to drive a DQ pad to the power supply voltage level, when the read enabled signal is enabled, and receive the DQ pad signal to drive the second global line to the driving voltage level, when the write enable signal is enabled.

2. The data transmission circuit of claim 1, wherein the write enable signal comprises a signal which is enabled during a write operation, and the read enable signal comprises a signal which is enabled during a read operation.

3. The data transmission circuit of claim 1, wherein the switch unit comprises:
   a switch signal generation section configured to perform a logical operation on the write enable signal and the read enable signal and generate a switch signal; and
   a switch element configured to transmit the driving voltage in response to the switch signal.

4. The data transmission circuit of claim 3, wherein the switch signal is enabled when the write enable signal is enabled.

5. The data transmission circuit of claim 4, wherein the switch signal is enabled when the read enable signal is enabled.

6. The data transmission circuit of claim 5, wherein the switch signal is disabled when the write enable signal and the read enable signal are disabled.

7. The data transmission circuit of claim 1, wherein the first transmission section comprises:
   a global driver configured to receive the data and drive the first global line to the driving voltage level; and
   a write driver configured to receive the signal of the first global line and drive the data to the power supply voltage level.

8. The data transmission circuit of claim 7, wherein the first transmission section further comprises a first latch configured to latch the signal of the first global line.

9. The data transmission circuit of claim 7, wherein the write driver comprises:
   a first level shifter configured to drive a node to the power supply voltage level in response to the signal of the first global line and generate first and second driving signals;
   a first driving controller configured to control the drive of the first level shifter in response to the write enable signal;
   a first driver configured to drive a node to the power supply voltage level in response to the first and second driving signals and generate preliminary data; and
   a first output section configured to be driven in response to the write enable signal and drive the data to the power supply voltage level according to a logic level of the preliminary data.

10. The data transmission circuit of claim 1, wherein the second transmission section comprises:
    a first repeater configured to receive the signal of the first global line and drive the second global line to the driving voltage level; and
    a second repeater configured to receive the signal of the second global line and drive the first global line to the driving voltage level.

11. The data transmission circuit of claim 10, wherein the second transmission section further comprises a second latch configured to latch the signal of the second global line.

12. The data transmission circuit of claim 1, wherein the third transmission section comprises:
    a pre-driver configured to drive pull-up and pull-down signals to the power supply voltage level in response to the signal of the second global line, when the read enable signal is enabled;
    an output driver configured to drive the DQ pad to output the data in response to the pull-up and pull-down signals;

an input buffer configured to receive the signal of the DQ pad and drive input data to the power supply voltage level, when the write enable signal is enabled; and an input driver configured to drive the second global line to the driving voltage level, in response to the input data.

13. The data transmission circuit of claim 12, wherein the pre-driver comprises:
- a second level shifter configured to drive a node to the power supply voltage level in response to the signal of the second global line and generate third and fourth driving signals;
- a second driving controller configured to control the drive of the second level shifter in response to the read enable signal;
- a second driver configured to drive a node to the power supply voltage level in response to the third and fourth driving signals and generate a preliminary up-down signal; and
- a second output section configured to be drive in response to the read enable signal and generate the pull-up and pull-down signals according to a logic level of the preliminary up-down signal.

14. The data transmission circuit of claim 13, wherein the pre-driver further comprises a transmission gate configured to transmit the preliminary up-down signal in response to an external clock signal.

15. A data transmission circuit comprising:
- a first transmission section configured to receive a data to drive a first global line to a driving voltage level, when a read enable signal is enabled, and receive a signal of the first global line to drive the data to a power supply voltage level, when a write enable signal is enabled;
- a second transmission section configured to receive the signal of the first global line to drive a second global line to the driving voltage level, when the read enable signal is enabled, and receive a signal of the second global line to drive the first global line to the driving voltage level, when the write enable signal is enabled; and
- a third transmission section configured to receive the signal of the second global line to drive a DQ pad to the power supply voltage level, when the read enabled signal is enabled, and receive the DQ pad signal to drive the second global line to the driving voltage level, when the write enable signal is enabled, wherein the driving voltage has a lower level than an external voltage, and the driving voltage is transmitted when any one of the write enable signal and the read enable signal is enabled.

16. The data transmission circuit of claim 15, wherein the driving voltage is transmitted by a switch unit configured to transmit the driving voltage when one of the write enable signal and read enable signal is enabled, and the write enable signal comprises a signal which is enabled during a write operation, and the read enable signal comprises a signal which is enabled during a read operation.

17. The data transmission circuit of claim 16, wherein the switch unit comprises:
- a switch signal generation section configured to perform a logical operation on the write enable signal and the read enable signal and generate a switch signal; and
- a switch element configured to transmit the driving voltage in response to the switch signal.

18. The data transmission circuit of claim 15, wherein:
the first transmission section comprises a global driver configured to receive the data and drive the first global line to the driving voltage level, and a write driver configured to receive the signal of the first global line and drive the data to the power supply voltage level;
the second transmission section comprises a first repeater configured to receive the signal of the first global line and drive the second global line to the driving voltage level, and a second repeater configured to receive the signal of the second global line and drive the first global line to the driving voltage level; and
the third transmission section comprises a pre-driver configured to drive pull-up and pull-down signals to the power supply voltage level in response to the signal of the second global line when the read enable signal is enabled, an output driver configured to drive the DQ pad to output the data in response to the pull-up and pull-down signals, an input buffer configured to receive the signal of the DQ pad and drive input data to the power supply voltage level when the write enable signal is enabled, an input driver configured to drive the second global line to the driving voltage level in response to the input data.

* * * * *